United States Patent
Kondo (10) Patent No.: US 6,365,823 B1
(45) Date of Patent: Apr. 2, 2002

(54) SOLAR CELL MODULE AND MANUFACTURING METHOD THEREOF

(75) Inventor: Masataka Kondo, Kobe (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/423,068

(22) PCT Filed: Jun. 17, 1998

(86) PCT No.: PCT/JP98/02715

§ 371 Date: Nov. 1, 1999

§ 102(e) Date: Nov. 1, 1999

(87) PCT Pub. No.: WO98/59378

PCT Pub. Date: Dec. 30, 1998

(30) Foreign Application Priority Data

Jun. 20, 1997 (JP) ............................................. 9-164299
Apr. 22, 1998 (JP) ........................................... 10-112398

(51) Int. Cl.$^7$ ...................... H01L 31/04; H01L 31/042; H01L 31/052
(52) U.S. Cl. ....................... 136/246; 136/256; 136/258; 136/261; 438/65; 438/66; 438/69; 438/71; 438/72; 438/73; 257/436; 257/434; 257/435
(58) Field of Search ................................ 136/246, 256, 136/258 AM, 258 PC, 261; 438/65, 66, 69, 71, 72, 73; 257/436, 434, 435

(56) References Cited

FOREIGN PATENT DOCUMENTS

| GB | 2188924 | * 10/1987 |
|---|---|---|
| JP | 59-48062 | * 3/1984 |
| JP | 60-88482 | * 5/1985 |
| JP | 60-151157 | * 10/1985 |
| JP | 60-216585 | * 10/1985 |
| JP | 1-117372 | 5/1989 |
| JP | 2-177573 | 7/1990 |
| JP | 4-2055 | * 1/1992 |
| JP | 5-218471 | 8/1993 |
| JP | 6-45628 | 2/1994 |
| JP | 7-79002 | 3/1995 |

OTHER PUBLICATIONS

General Electric Company in the 16$^{th}$ IEEE Photovoltaic Specialists Conference, 1982 (proceedings pp. 828–833), Sep. 27–30, 1982.

* cited by examiner

Primary Examiner—Alan Diamond
(74) Attorney, Agent, or Firm—Birch, Stewart, Kolasch & Birch, LLP (57) ABSTRACT

A thin film based solar cell module having superior appearance without glittering, and method of manufacturing the same in a simple manner at a low cost are provided. The solar cell module includes a glass substrate 10 and a photo semiconductor element formed on a surface different from a light entering surface of glass substrate 10. The glass substrate 10 is formed of a figured glass having recesses and protrusions formed to provide antiglaring effect, on the light entering surface. The photo semiconductor element is formed by successively stacking a transparent electrode 2, a photo semiconductor layer 3 and a back electrode layer 5.

7 Claims, 7 Drawing Sheets

SOLAR CELL MODULE AND MANUFACTURING METHOD THEREOF

This application is the national phase under 35 U.S.C. §371 of PCT International Application NO. PCT/JP98/02715 which has an International filing date of Jun. 17, 1998, which designated the United States of America.

TECHNICAL FIELD

The present invention relates to a solar cell module and manufacturing method thereof and, more specifically, to a solar cell module used for solar electricity generation and manufacturing method thereof.

BACKGROUND ART

Recently, new energy has been attracting attention in view of environmental problems such as $CO_2$ increase and exhaustion of natural resources, and, among others, solar electricity generation has been considered promising. A solar cell module as the main component thereof includes crystal based modules and thin film based modules.

The crystal based solar cell module is formed by arranging twenty to thirty crystal plates (wafers) of small area on a glass plate (cover glass) of which size corresponds to the size of the module, which are interconnected to each other, and sealed and protected by a filler such as EVA (ethylenevinyl acetate copolymer) and a back surface protective film such as Tedlar (registered trademark).

In a thin film based solar cell module (solar cell module formed on a substrate), a transparent electrode layer, a thin film semiconductor layer and a back electrode layer are directly formed on a glass plate of the size of the module successively, respective layers are separated by patterning means such as laser scribe, and connected so that desired voltage and current are obtained. As to sealing and protection, filler and surface protective film similar to those used for the crystal based solar cell module are used. The thin film based solar cell module structured as described above is advantageous in view of cost as compared with the crystal based solar cell module, in that the layer contributing to electricity generation is thin, that only one structural material is necessary, and that interconnection is simple.

As to the recent state of installment of the solar cell modules, it is not often the case that a large number of solar cell modules are used placed side by side at a remote site for solar electricity generation, and in most cases, the modules are installed on a roof of a house or installed as roof integrated type solar cell modules which also function as the house roof. Further, in these days, a so called grid connection system comes to be widely popular in which the solar cell module is installed on the roof to generate power to be consumed by the house and to sell surplus power to an electric power company, and therefore solar electricity generation systems developed for detached houses have been increasing. Such systems are developed on the premise that the solar cell module is installed on the roof of the house, and therefore appearance of the building itself and coordination with other houses therearound are of importance. In such an environment, when the surface of the solar cell module is like a mirror reflecting sun light, neighbors and passers-by may make complaints about "glare" and "glittering." Further, architects have pointed out the problem that when the module is used as the roof material, scenery and sky are reflected on the surface of the module, impairing stylish appearance of the building.

The following measures have been devised for these problems.

For example, for a crystal based solar cell module, use of a figured glass as the cover glass has been proposed to cause random reflection and diffusion of light at the surface of the cover glass. In fact, figured glass used as the cover glass solely for this purpose is commercially available from AFG Industries Inc. of the United States, under the trade names of "Sunadex", "Solite" and "Solatex". Further, it is disclosed by General Electric Company in the 16th IEEE Photovoltaic Specialists Conference, 1982 (proceedings pp. 828–833) that those figured glasses were utilized for roof tile solar cell modules.

For the thin film based solar cell modules, sealing of sub modules small in area by the structure similar to that of the crystal based solar cell modules and use of the above described dedicated figured glass as the cover glass have been studied. Further, Japanese Patent Laying-Open No. 6-45628, for example, proposes application of a resin containing beads mixed therein for scattering light to the surface of the finished solar cell module.

The above described methods, however, involve more complicated manufacturing steps than the general method, when applied to the thin film based solar cell modules, and therefore the cost advantage of the thin film based solar cell modules described above will be lost.

The method of adhering the figured glass as a cover glass increases weight, causes the problem of weather resistance of the adhesive resin for adhesion, and lowers photoelectric conversion characteristic as-the amount of sun light reaching the solar cell decreases. Further, the method of applying resin to the surface of the module causes the problem of weather resistance of the resin.

An object of the present invention is to solve various conventional problems experienced when the unsatisfactory appearance such as glittering as described above is to be prevented, and to provide a thin film based solar cell module of superior appearance free of glittering or the like as well as to provide the method of manufacturing the same in a simple manner at a low cost.

DISCLOSURE OF THE INVENTION

The solar cell module in accordance with the present invention includes a glass substrate having first and second surfaces, and a photo semiconductor device formed on the first surface of the glass substrate, wherein the glass substrate is formed of a figured glass having recesses and protrusions formed to provide antiglare effect on the second surface through which light enters, and the photo semiconductor device is formed of a first electrode layer, a photo semiconductor layer and a second electrode layer stacked successively.

Preferably, the photo semiconductor device may have the first electrode layer, the photo semiconductor layer and the second electrode layer divided into a plurality of areas, the second surface of the glass substrate may have arithmetic mean roughness Ra in the range of 50 $\mu$m to 500 $\mu$m, and mean distance Sm of the recess and protrusion may be within the range of 0.1 mm to 10 mm.

Preferably, at least one of the first electrode layer, the photo semiconductor layer and the second electrode layer may be divided into the plurality of areas by the step of laser patterning, and the second surface of the glass substrate may be formed to have arithmetic mean roughness Ra of at most 500 $\mu$m in that area which corresponds to 100 $\mu$m to 5000 $\mu$m in the periphery of the portion irradiated with laser in the step of laser patterning.

More preferably, the second surface of the glass substrate may be formed to have arithmetic mean roughness Ra of at most 100 μm in the region corresponding to 100 μm to 5000 μm in the periphery of the portion irradiated with laser in the step of laser patterning.

The method of manufacturing a solar cell module in accordance with the present invention includes the steps of successively stacking a first electrode layer, a photo semiconductor layer and a second electrode layer on a first surface of a glass substrate, and dividing the first electrode layer, the photo semiconductor layer and the second electrode layer into a plurality of areas, wherein at least one of the first electrode layer, the photo semiconductor layer and the second electrode layer is divided into the plurality of areas by the step of laser patterning, the glass substrate is formed of a figured glass having recesses and protrusions for providing antiglare effect formed on a second surface through which light enters, and the method further includes, before the step of laser patterning, the step of placing a transparent material having index of refraction of 1.3 to 1.7 on at least a portion to be irradiated with laser of the second surface of the glass substrate for smoothing the surface to be irradiated with laser.

Preferably, the method may further include the step of removing the transparent material after the step of laser patterning.

Preferably, the index of refraction of the transparent material is 1.45 to 1.55.

BEST MODES FOR CARRYING OUT THE INVENTION

In the following, a solar cell module having one stage of solar cells including amorphous semiconductor connected in longitudinal direction, integrated in module plane and connected, will be described as an example of the present invention.

Figure 1:
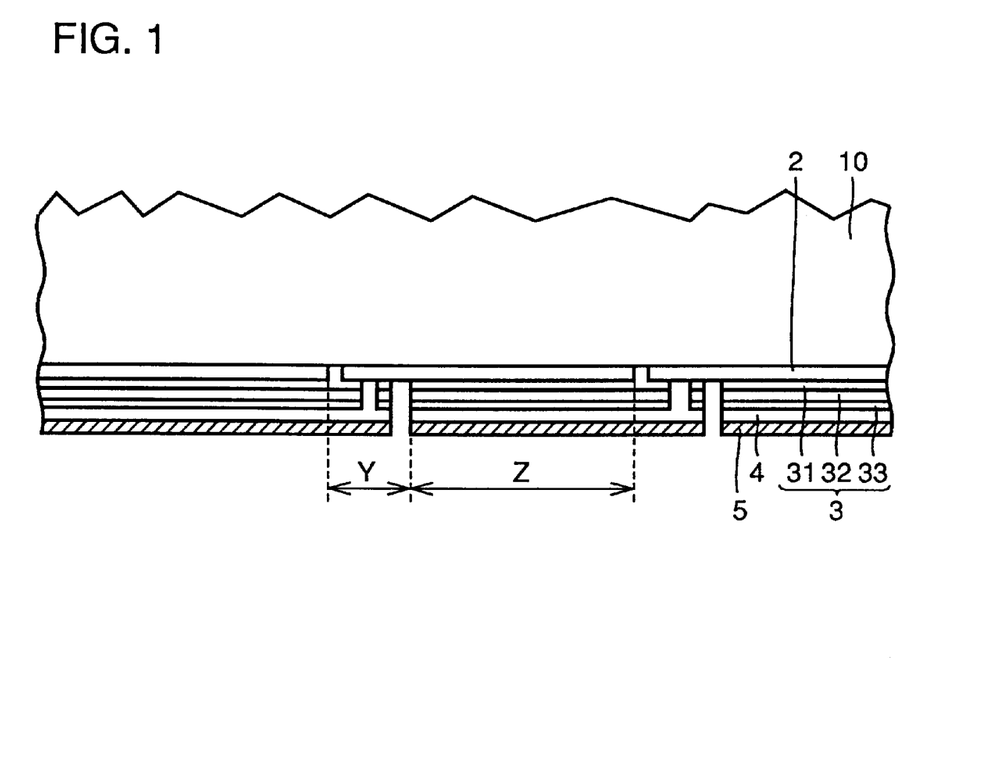
FIG. 1 is a cross sectional view representing a schematic structure of a portion of the solar cell module in accordance with a first embodiment of the present invention.

FIG. 1 is a cross sectional view representing a schematic structure of a portion of the solar cell module in accordance with a first embodiment of the present invention.

Referring to FIG. 1, the solar cell module includes a glass substrate 10, a transparent electrode layer 2 formed on a surface different from light entering surface of glass substrate 10, a photo semiconductor layer 3 formed on transparent electrode layer 2, and a back electrode layer 5 formed on photo semiconductor layer 3 with a reflection promoting layer 4 interposed.

A photo transmitting material such as ITO, $SnO_2$ or $ITO/SnO_2$, which is a stacked body of these, for example, may be used as transparent electrode layer 2.

In the present embodiment, photo semiconductor layer is formed by successively stacking a p type amorphous silicon semiconductor layer 31, an i type amorphous silicon semiconductor layer 32 and an n type amorphous silicon semiconductor layer 33. The structure of photo semiconductor layer 3 is not limited to this, in the present invention. More specifically, as photo semiconductor layer 3, a semiconductor layer in which amorphous or microcrystal of amorphous silicon based semiconductor such as amorphous silicon a-Si, amorphous silicon hydride a-Si:H, amorphous silicon carbide hydride a-SiC:H, amorphous silicon nitride or the like, or an alloy of silicon and carbide, germanium, tin or other element is synthesized to pin type, nip type, ni type, pn type, MIS type, hetorojunction type, homojunction type, shot key barrier type or combination thereof may be used.

Further, the photo semiconductor device formed by successively stacking transparent electrode 2, photo semiconductor layer 3 and back electrode layer 5 is divided into a plurality of areas Z as a trench is formed in at least any of the transparent electrode layer 2, photo semiconductor layer 3 and back electrode layer 5 at the portion Y shown in FIG. 1, with respective areas Z being electrically connected to each other in series or in parallel.

As the material of the glass substrate, soda lime glass such as blue plate glass and white plate glass, pyrex or borosilicate glass such as low alkali glass of a little higher grade may be used. A figured glass having recesses and protrusions formed on the surface through which light enters is used as glass substrate 10. More specifically, surface roughness of the light entering surface of glass substrate 10 has arithmetic mean roughness Ra within the range of 50 to 500 μm, with mean distance Sm between the recesses and protrusions is within the range of 0.1 mm to 10 mm.

In the solar cell module having the structure shown in FIG. 1, in order to attain sufficient antiglare effect to prevent unsatisfactory appearance such as "glittering", surface roughness of the light entering surface of glass substrate 10 should preferably have arithmetic mean roughness Ra value of at least 50 μm, and more preferably, at least 100 μm. The value of the mean distance Sm between the recesses and protrusions is preferably at most 10 mm and more preferably, at most 3 mm.

As will be described later, considering that the photo semiconductor device is divided into a plurality of areas in the step of laser patterning, surface roughness of the light entering surface of glass substrate 1 should preferably have the arithmetic mean roughness Ra value of at most 500 $\mu$m and more preferably, at most 100 $\mu$m. Further, the value of mean distance Sm between recesses and protrusions should preferably be at least 0.1 mm and more preferably at least 1 mm.

The thin film based solar cell module structured in this manner surely provides desired voltage and current.

The method of manufacturing the solar cell module in accordance with the first embodiment shown in FIG. 1 will be described in the following. FIGS. 2 to 7 are cross sectional views illustrating the method of manufacturing the solar cell module in accordance with the first embodiment shown in FIG. 1.

Figure 2:
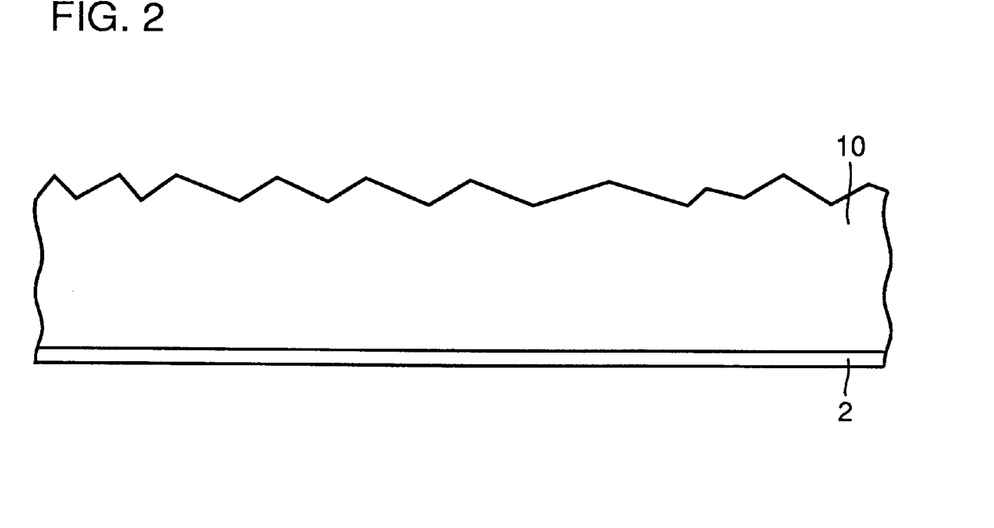
FIG. 2 is a cross sectional view illustrating the method of manufacturing the solar cell module in accordance with the first embodiment.

First, referring to FIG. 2, entirely on a surface different from the light entering surface of figured glass 10 having prescribed recesses and protrusions formed on the light entering surface, transparent electrode 2 is formed.

Figure 3:
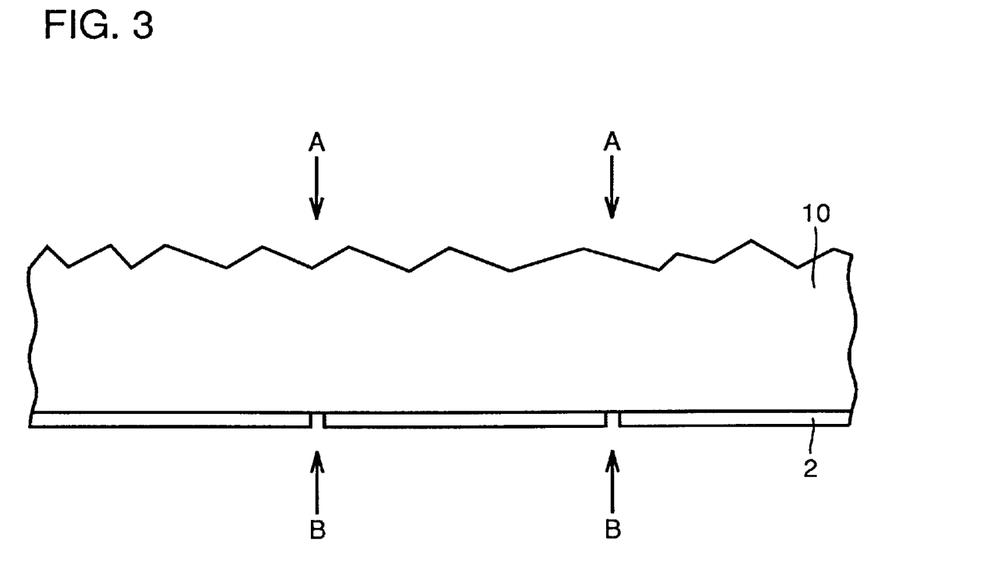
FIG. 3 is a cross sectional view illustrating the method of manufacturing the solar cell module in accordance with the first embodiment.

Thereafter, referring to FIG. 3, a prescribed position of glass substrate 10 with transparent electrode 2 formed is irradiated with laser beam, so that a prescribed portion of transparent electrode 2 is removed until glass substrate 10 is exposed, whereby transparent electrode layer 2 is divided into a plurality of areas. The laser beam may be directed from the light entering surface side of glass substrate 10 as represented by an arrow A, or may be directed from the side of the photo semiconductor device forming surface, different from the light entering surface, as shown by an arrow B.

Figure 4:
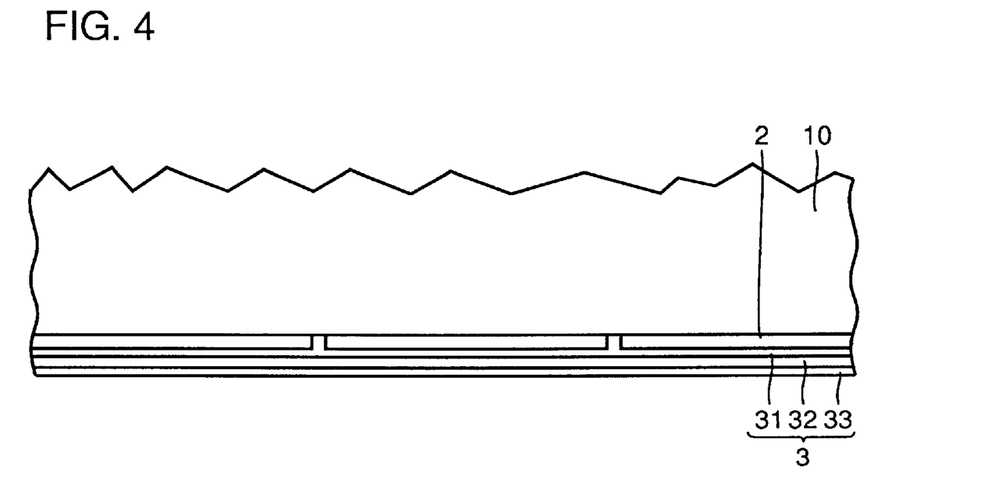
FIG. 4 is a cross sectional view illustrating the method of manufacturing the solar cell module in accordance with the first embodiment.

Thereafter, referring to FIG. 4, on transparent electrode 2 and on glass substrate 10 exposed by laser irradiation, p type amorphous silicon semiconductor layer 31, i type amorphous silicon semiconductor layer 32 and n type amorphous silicon semiconductor layer 33 are stacked successively. In the present embodiment, photo semiconductor layer 3 is formed by three layers, that is, p type amorphous silicon semiconductor layer 31, i type amorphous silicon semiconductor layer 32 and n type amorphous silicon semiconductor layer 33.

Figure 5:
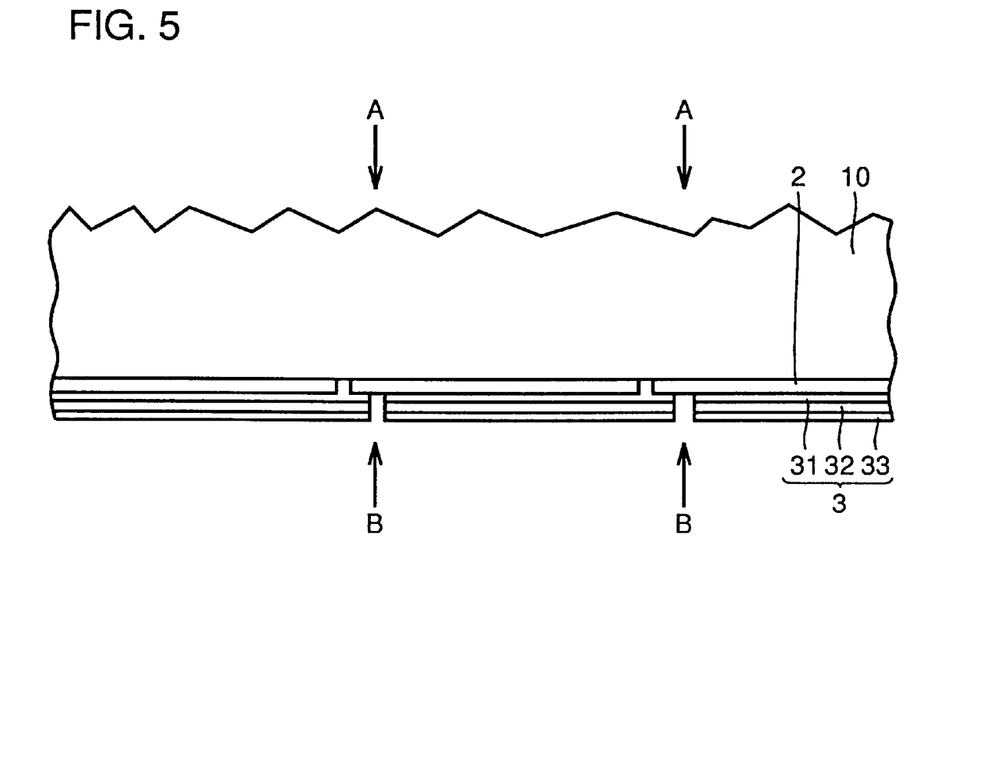
FIG. 5 is a cross sectional view illustrating the method of manufacturing the solar cell module in accordance with the first embodiment.

Thereafter, referring to FIG. 5, a prescribed position of glass substrate 10 having transparent electrode 2 and photo semiconductor layer 3 formed is irradiated with laser beam, so that a prescribed portion of photo semiconductor layer 3 is removed until transparent electrode layer 2 is exposed, whereby the photo semiconductor layer 3 is divided into a plurality of areas. The laser beam may be directed from the light entering surface side of glass substrate 10 as represented by the arrow A, or it may be directed from the side of the semiconductor electrode forming surface different from the light entering surface as represented by the arrow B.

Figure 6:
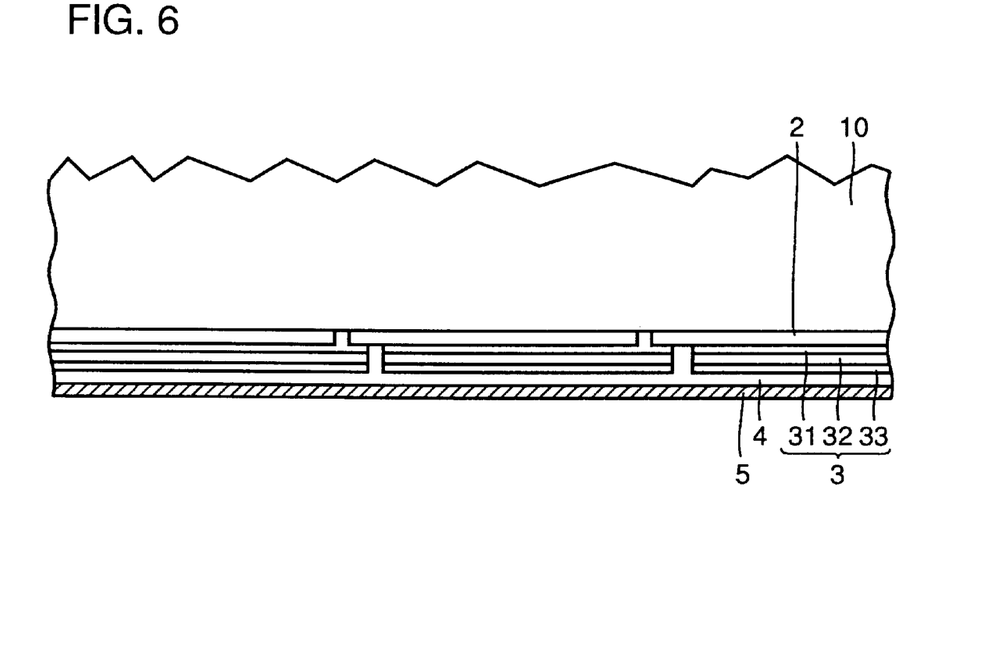
FIG. 6 is a cross sectional view illustrating the method of manufacturing the solar cell module in accordance with the first embodiment.

Thereafter, referring to FIG. 6, on photo semiconductor layer 3 and transparent electrode 2 exposed by laser irradiation, reflection promoting layer 4 is formed and back electrode layer 5 is formed further thereon. Though reflection promoting layer 4 is interposed between photo semiconductor layer 3 and back electrode layer 5 in the present embodiment, back electrode layer 5 may be formed directly on photo semiconductor layer 3.

Figure 7:
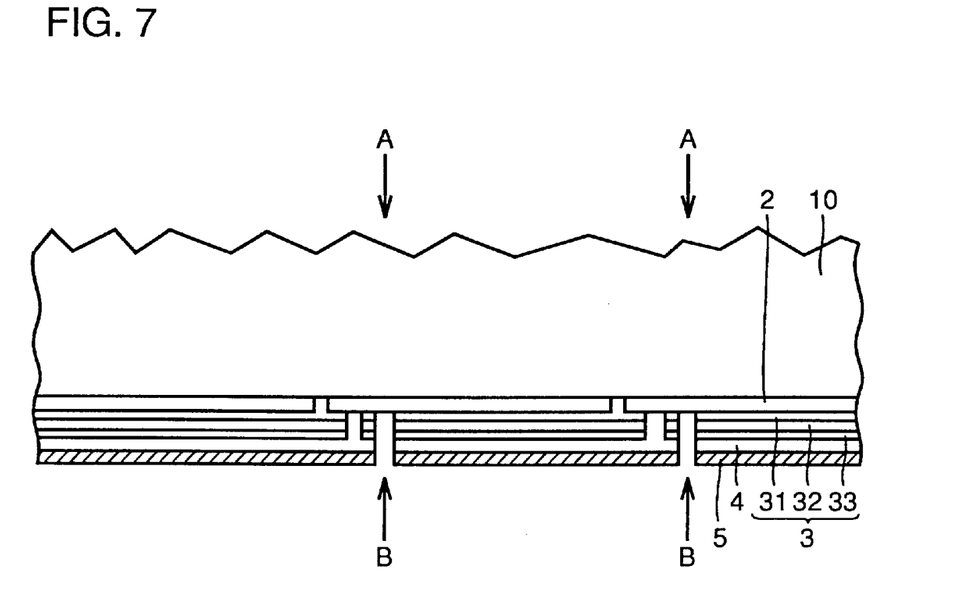
FIG. 7 is a cross sectional view illustrating the method of manufacturing the solar cell module in accordance with the first embodiment.

Thereafter, referring to FIG. 7, a prescribed position of glass substrate 10 having transparent electrode 2, photo semiconductor layer 3, reflection promoting layer 4 and back electrode layer 5 formed thereon is irradiated with laser beam so that a prescribed portion of photo semiconductor Layer 3, reflection promoting layer 4 and back electrode layer 5 is removed until transparent electrode layer 2 is exposed, whereby photo semiconductor layer 3, reflection promoting layer 4 and back electrode layer 5 are divided into a plurality of areas. The laser beam may be directed from the light entering surface side of glass substrate 10 as represented by the arrow A, or it may be directed from the side of the photo semiconductor device forming surface different from the light entering surface, as represented by the arrow B.

Though photo semiconductor layer 3, reflection promoting layer 4 and back electrode layer 5 are removed by laser irradiation until transparent electrode layer 2 is exposed in the present embodiment, only the reflection promoting layer 4 and back electrode layer 5 may be removed until photo semiconductor layer 3 is exposed.

Thereafter, a lead out electrode is attached to transparent electrode layer 2 and back electrode layer 5, and the photo semiconductor device forming surface of glass substrate 10 is sealed and protected by using a filler such as EVA and a back surface protective film such as Tedler. As the filler, polyvinyl butyral or the like may be used other than EVA. EVA (index of refraction: 1.482), polyvinyl butyral (index of refraction: 1.48 to 1.49) and the like are designed to have the index of refraction close to that of soda lime glass (index of refraction: 1.51 to 1.52), borosilicate glass (index of refraction: 1.47) or the like used as the glass substrate.

By further attaching a terminal box and a frame to the solar cell obtained sealed in this manner, the solar cell module of the first embodiment is completed.

Figure 8:
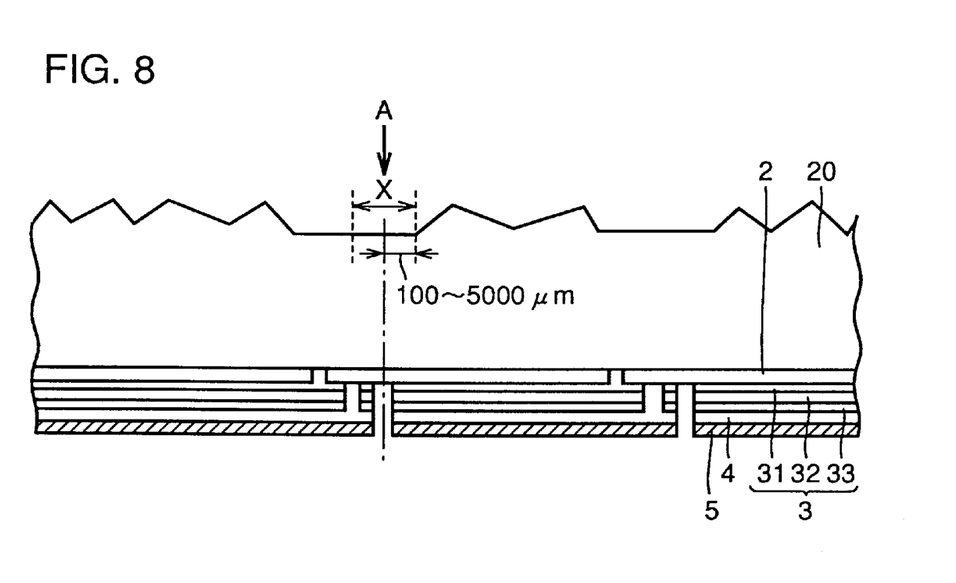
FIG. 8 is a cross sectional view representing a schematic structure of a portion of the solar cell module in accordance with a second embodiment of the present invention.

FIG. 8 is a cross sectional view representing a schematic structure of a portion of the solar cell module in accordance with a second embodiment of the present invention.

Referring to FIG. 8, in the solar cell module, of the light entering surface of glass substrate 20, an area X which corresponds to 100 $\mu$m to 500 $\mu$m around the center which is irradiated with laser in the step of laser patterning has arithmetic mean roughness Ra of at most 500 $\mu$m.

Other areas of the light entering surface of glass substrate 20 has recesses and protrusions formed to provide antiglaring effect.

The structure of the solar cell module in accordance with the second embodiment other than this point is completely the same as the structure of the solar cell module in accordance with the first embodiment shown in FIG. 1, and therefore, description thereof is not repeated. Further, the method of manufacturing the solar cell module in accordance with the second embodiment is the same as the method of manufacturing the solar cell module in accordance with the first embodiment shown in FIGS. 2 to 7, and therefore, description thereof is not repeated, either.

Figure 9:
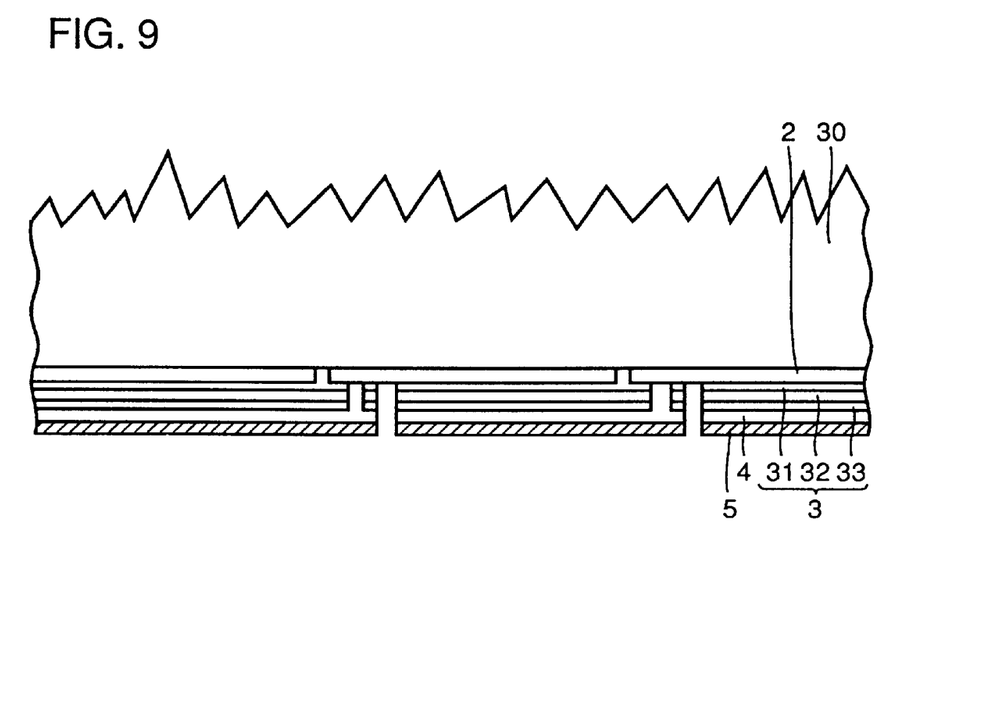
FIG. 9 is a cross sectional view representing a schematic structure of a portion of the solar cell module in accordance with a third embodiment of the present invention.

FIG. 9 is a cross sectional view representing a schematic structure of a portion of the solar cell module in accordance with a third embodiment of the present invention.

Referring to FIG. 9, in the solar cell module, arithmetic mean roughness Ra of the light entering surface of glass substrate 30 is larger than 500 $\mu$m.

The structure of the solar cell module in accordance with the third embodiment except this point is the same as the structure of the solar cell module in accordance with the first embodiment shown in FIG. 1, and therefore, description thereof is not repeated.

The method of manufacturing the solar cell module in accordance with the third embodiment structured as above will be described.

Figure 10:
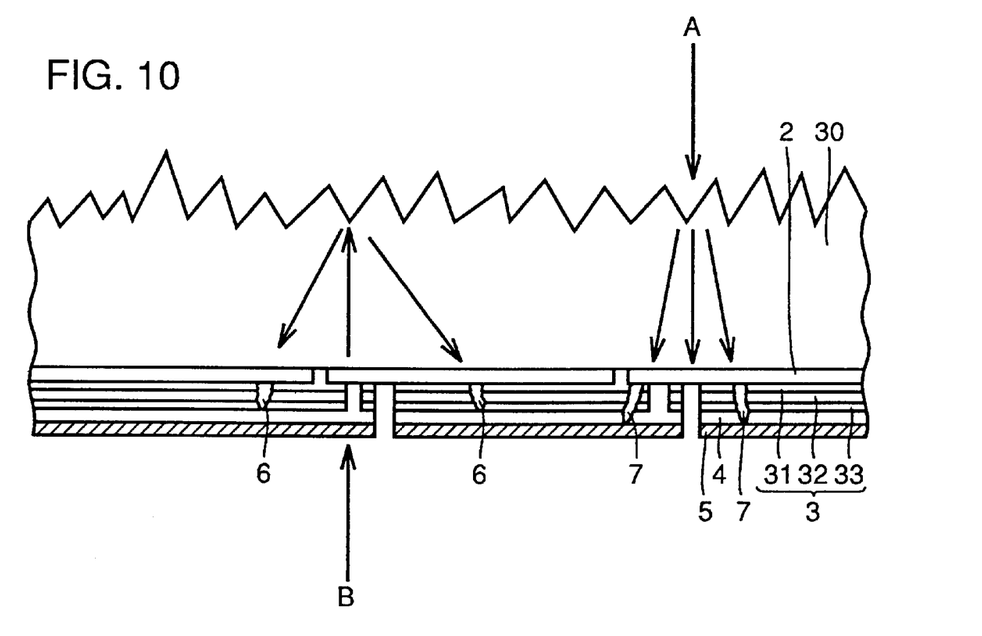
FIG. 10 is an illustration related to a problem experienced in manufacturing the solar cell module in accordance with the third embodiment.

FIG. 10 is an illustration showing a problem experienced in manufacturing the solar cell module in accordance with the third embodiment.

Referring to FIG. 10, in the solar cell module in accordance with the third embodiment, arithmetic mean roughness Ra of the light entering surface of glass substrate 30 is larger than the arithmetic mean roughness Ra of the light entering surface of glass substrate 10 in the solar cell module in accordance with the first embodiment shown in FIG. 1.

Therefore, when the step of laser patterning such as laser scribe is performed as shown in FIGS. 2 to 7, the irradiated laser beam scatters at the recesses and protrusions formed on the light entering surface of the glass substrate. As a result, excessive laser energy is directed around the portion to be laser-processed, resulting in degradation in quality or unnecessary processing of layers, or the laser energy may not be concentrated to the portion to be processed, resulting in failure of the necessary process.

More specifically, when the laser beam is directed from the light entering surface as represented by the arrow A in FIG. 10, the laser beam reaching the light entering surface with recesses and protrusions formed of glass substrate 30 scatters as represented by the arrows, so that various portions are irradiated with the laser beam. As a result, laser processing of the portion to be processed may be insufficient, while unnecessary processing is done at portions of photo semiconductor layer 3 and reflection promoting layer 4, possibly resulting in defects 7 such as a pin hole or a short defect.

When the laser beam is directed from the photo semiconductor device forming surface as represented by the arrow B of FIG. 10, the laser beam reaching the light entering surface having recesses and protrusions formed of glass substrate 30 is reflected at random as represented by the arrows, whereby portions around the portion to be processed are irradiated. As a result, portions of the photo semiconductor layer 3 are unnecessarily processed, resulting in defects 6 such as a pin hole or a short defect.

Figure 11:
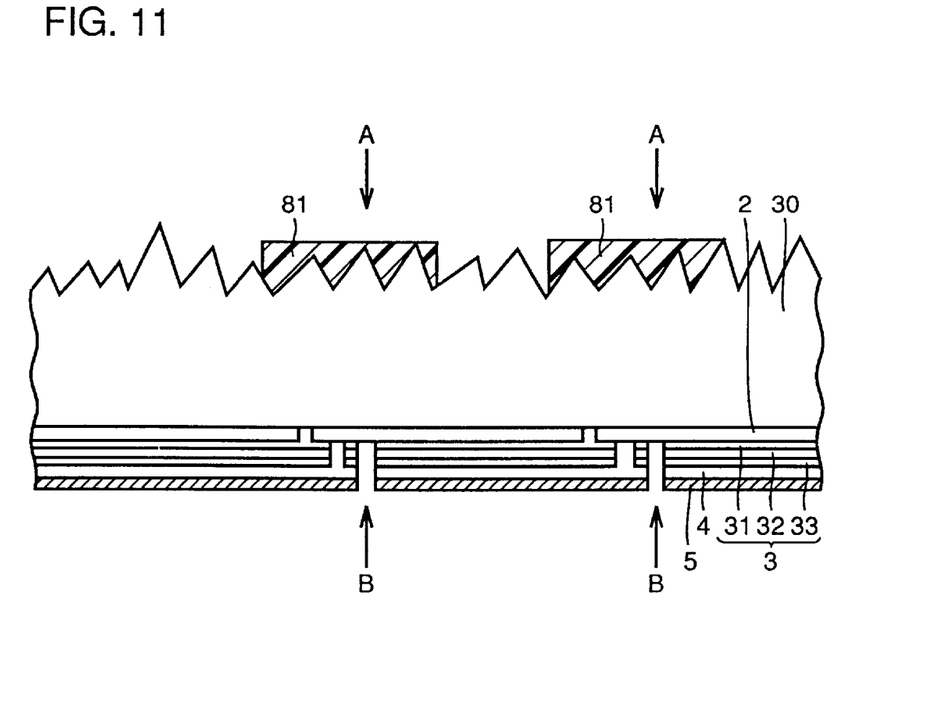
FIG. 11 is a cross sectional view illustrating an example of the method of manufacturing the solar cell module in accordance with the third embodiment employing the step of laser patterning, in accordance with the present invention.

FIG. 11 is a cross sectional view illustrating an example of the method of manufacturing the solar cell module in accordance with the third embodiment, employing the step of laser patterning while solving such problems.

Referring to FIG. 11, in the method, a leveling agent 81 for smoothing the laser irradiation surface is applied at least to a portion to be irradiated with the laser, in the step of laser patterning such as laser scribe, so as to prevent scattering of light. As leveling agent 81, a material having index of refraction close to that of soda lime glass (index of refraction: 1.51 to 1.52) or borosilicate glass (index of refraction: 1.47) used as the glass substrate is used. Preferably, a material having index of refraction of 1.3 to 1.7 and more preferably, index of refraction of 1.45 to 1.55 is preferably used as the leveling agent. When a material having index of refraction of 1.45 to 1.55 is used as the leveling agent, for example, satisfactory edge can be obtained even when patterning of 100 μm in width is performed by laser scribe.

Preferably, transparent liquid, grease like material, or transparent resin like material allowing easy application before laser processing is used as the leveling agent. After laser processing, the leveling agent may be left as it is or removed, and in view of safety, conditions of process steps and the like, the material is appropriately selected, not limited to the examples listed below. Further, the leveling agent may be applied only to the portion to be laser-processed, or it may be applied to the entire light entering surface of the glass substrate if the agent is to be removed after laser processing.

More specifically, examples of the leveling material which is solid material and to be left after laser processing include vinyl acetate resin (index of refraction: 1.45 to 1.47), polyethylene (index of refraction: 1.51), polyester (index of refraction: 1.523 to 1.57), methyl methacrylate resin (index of refraction: 1.488 to 1.49), vinyl chloride resin (index of refraction: 1.54 to 1.55) and polyvinyl alcohol (index of refraction: 1.49 to 1.55). Resin such as EVA (index of refraction: 1.482), polyvinyl butyral (index of refraction: 1.48 to 1.49) or the like is designed to have the index of refraction close to that of the glass substrate material and has been conventionally used as the filler of the solar cell module, and therefore such resin is particularly preferable, as it is readily available.

Examples of the leveling material which is liquid based material and to be removed after laser processing includes o-xylene (index of refraction: 1.51), glycerin (index of refraction: 1.48), chlorobenzene (index of refraction: 1.52), tetrachloroethylene (index of refraction: 1.51), carbon tetrachloride (index of refraction: 1.461) and etylbenzene (index of refraction: 1.5). Further, among liquids used in immersion method, which is the conventional method of measuring index of refraction of a crystal, 1,2-dibromopropane (index of refraction: 1.516) and a mixed liquid of terpentine oil and 1,2-dibromoethylene (index of refraction: 1.48 to 1.535) have been known as having index of refraction close to 1.5, which can appropriately be utilized as the leveling agent. Further, water (index of refraction: 1.33) is easy to handle and safe, and therefore it is a particularly preferable leveling agent.

Figure 12:
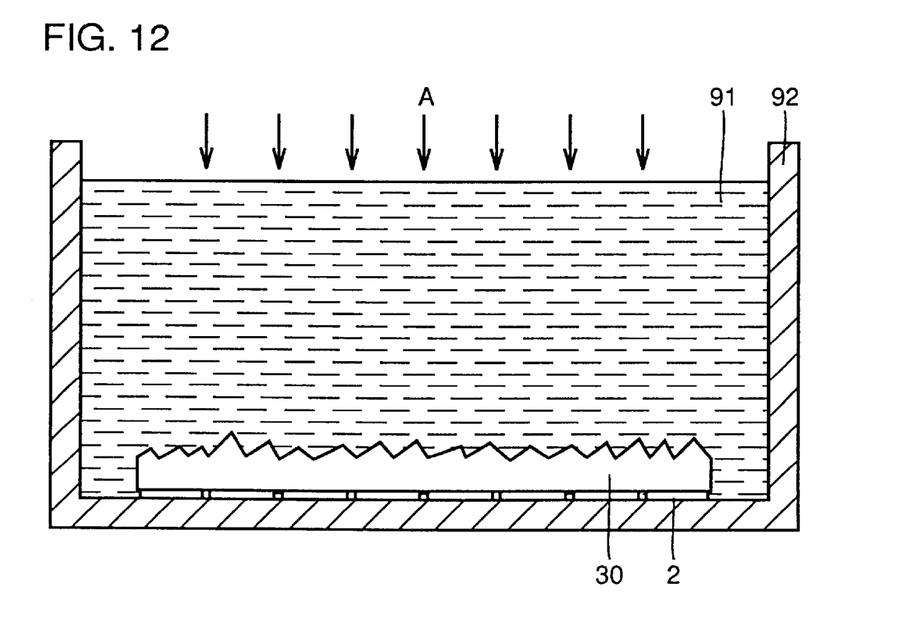
FIG. 12 is a cross sectional view illustrating an example of the method of manufacturing the solar cell module in accordance with the third embodiment employing the step of laser patterning, in accordance with the present invention.

FIG. 12 is a cross sectional view illustrating another example of the method of manufacturing the solar cell module in accordance with the third embodiment employing the step of laser patterning.

Referring to FIG. 12, in this method, in the step of laser patterning such as laser scribe, laser irradiation is performed while the glass substrate 30 is immersed in water 91 contained in a container 92 without any lid. As described above, index of refraction of water is very close to that of glass. Therefore, by this method, the laser irradiation surface becomes smooth, as when the leveling material is applied in the example of FIG. 11. As a result, scattering of light is prevented, ensuring satisfactory patterning.

Specific examples will be described in the following.

EXAMPLE 1

The solar cell module having the structure shown in FIG. 1 was fabricated in the following manner.

As glass substrate 10, template-processed white plate glass (float glass with ions removed) was used. Recesses and protrusions were formed on the light entering surface of glass substrate 10 with the arithmetic mean roughness Ra of 3000 μm and mean distance Sm between recesses and protrusions of 1 mm. The size of the glass substrate 10 was 450 mm×900 mm, and the thickness was 4 mm, so as to maintain strength of the module.

On a surface different from the light entering surface having recesses and protrusions formed thereon of glass substrate 10, an $SnO_2$ transparent electrode layer 2 having the thickness of about 700 nm was formed as shown in FIG. 2. The surface of the thus formed $SnO_2$ layer 2 had recesses and protrusions of about 200 nm.

Thereafter, the thus formed $SnO_2$ transparent electrode layer 2 was patterned by laser scribe, as shown in FIG. 3.

Thereafter, as shown in FIG. 4, photo semiconductor layer 3 was formed by parasitic CVD method on $SnO_2$ layer 2 and on exposed glass substrate 10. More specifically, a p type amorphous silicon carbide hydride a-SiC:H layer 31 was stacked by decomposing $SiH_4$, $B_2H_6$ and $CH_4$, i type amorphous silicon hydride a-Si:H layer 32 was stacked by decomposing $SiH_4$, and n type amorphous silicon hydride a-Si:H layer 33 was stacked decomposing $SiH_4$ and $PH_3$, successively, to form photo semiconductor layer 3.

Thereafter, the thus formed photo semiconductor layer 3 was patterned by laser scribe as shown in FIG. 5.

Thereafter, as shown in FIG. 6, on the photo semiconductor layer and the exposed $SiO_2$ transparent electrode layer 2, reflection promoting layer 4 of ZnO and back electrode layer 5 of Ag as high reflective metal were stacked by spattering.

Thereafter, the thus formed reflection promoting layer 4 and back electrode layer 5 were patterned by laser scribe as shown in FIG. 7.

Finally, a lead-out electrode was attached to transparent electrode 2 and back electrode 5, the semiconductor device forming surface was sealed and protected by using EVA and Tedler, and a terminal box and a frame were attached.

In this manner, the solar cell module having the structure shown in FIG. 1 was obtained. In the solar cell module, the length of area Y where a trench was formed by laser scribe was about 300 $\mu$m, and the length of each area Z of the photo semiconductor device divided into a plurality of areas was about 9 mm.

For laser scribe, laser irradiation was performed from the side of the light entering surface of glass substrate 10 represented by the arrow A and from the side of the photo semiconductor device forming surface represented by the arrow B, of FIGS. 3, 5 and 7. As a result, it was found that satisfactory patterns could be formed no matter from which side the laser irradiation was performed, and there was no problem experienced in the step of laser patterning.

The solar cell module obtained in this manner was installed on a roof, and observed at a distance of 20 m. As a result, it was found that satisfactory appearance without glittering was attained.

Comparative Example 1

A solar cell module was fabricated in the similar manner as Example 1, using a common flat glass as the glass substrate.

Figure 13:
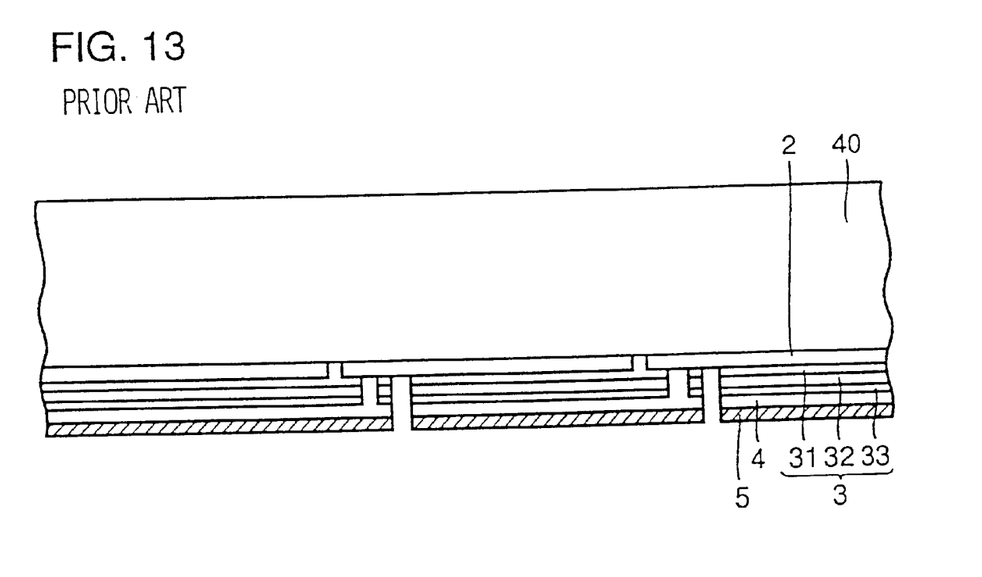
FIG. 13 is a cross sectional view representing a schematic structure of a portion of a solar cell module of a comparative example.

FIG. 13 is a cross sectional view representing a schematic structure of a portion of the thus obtained solar cell module.

Referring to FIG. 13, in the solar cell module, the light entering surface of glass substrate 40 did not have any recesses or protrusions formed but was flat. The structure other than this point was the same as the solar cell module of Example 1 shown in FIG. 1, and therefore, description thereof is not repeated.

The solar cell module obtained in this manner was installed on a roof and observed from a distance of 20 m. As a result, it was found that scenery therearound was reflected because of mirror like reflection, and therefore the appearance as the building material was unsatisfactory.

Comparative Example 2

A figured glass having recesses and protrusions formed on the light entering surface with arithmetic mean roughness Ra of 600 $\mu$m and mean distance Sm between recesses and protrusions of 1 mm was used as the glass substrate, and the solar cell module was fabricated in the similar manner as in Example 1.

As a result, when the laser beam was directed from the side of the photo semiconductor device forming surface, pin hole was generated because of random reflection of light as shown in FIG. 10, resulting in short defect. When the laser beam was directed from the light entering surface side, portions other than desired were processed by scattering of light as shown in FIG. 10, and patterning was not satisfactory.

Comparative Example 3

A figured glass having recesses and protrusions formed on the light entering surface with arithmetic mean roughness Ra of 200 $\mu$m and mean distance Sm between recesses and protrusions of 0.05 mm was used as the glass substrate, and the solar cell module was fabricated in the similar manner as in Example 1.

As a result, when the laser beam was directed from the side of the photo semiconductor device forming surface, pin hole was generated because of random reflection of light as shown in FIG. 10, resulting in short defect. When the laser beam was directed from the light entering surface side, portions other than desired were processed by scattering of light as shown in FIG. 10, and patterning was not satisfactory.

EXAMPLE 2

A figured glass having recesses and protrusions on that area of the light entering surface which corresponded to 100 $\mu$m around a portion which was irradiated with laser in the step of laser patterning with arithmetic mean roughness Ra of 50 $\mu$m and mean distance Sm between recesses and protrusions of 1 mm, and on other areas of the light entering surface to provide antiglaring effect caused by diffusion of light was used as the glass substrate, and the solar cell module was fabricated in the similar manner as in Example 1.

For laser scribe, laser irradiation was performed both from the side of the glass substrate and from the side of the photo semiconductor element forming surface. As a result, it was found that satisfactory patterns could be formed no matter from which side laser irradiation was performed, and no problem was experienced in the step of laser patterning.

The solar cell module provided in this manner was installed on a roof and observed from a distance of 20 m. As a result, it was found that satisfactory appearance without glittering was attained.

EXAMPLE 3

A figured glass having a smooth texture comparative to a common flat glass in that region of the light entering surface which corresponded to 100 $\mu$m around the portion irradiated with laser in the step of laser patterning and having recesses and protrusions formed to provide antiglaring effect caused by diffusion of light on other areas of the light entering surface was used as the glass substrate, and the solar cell module was fabricated in the similar manner as in Example 1.

For laser scribe, laser irradiation was performed both from the side of the light entering surface and from the side of the photo semiconductor element forming surface of the glass substrate. As a result, it was found that satisfactory patterns could be formed no matter from which side laser irradiation was performed, and no problem was experienced in the step of laser patterning.

The solar cell module provided in this manner was installed on a roof and observed from a distance of 20 m. As a result, it was found that satisfactory appearance without glittering was attained.

EXAMPLE 4

A figured glass having the similar shape as that used in Comparative Example 2 was used as the glass substrate, and the solar cell module was fabricated in accordance with the method described with reference to FIG. 11.

More specifically, on that region which corresponded to 100 μm around the portion irradiated with laser in the step laser patterning, carbon tetrachloride as the leveling agent was applied and thereafter laser scribe processing was performed. After laser processing, the leveling agent was removed.

For laser scribe, laser irradiation was performed both from the side of the light entering surface and from the side of the photo semiconductor element forming surface of the glass substrate. As a result, it was found that satisfactory patterns could be formed no matter from which side laser irradiation was performed, and no problem was experienced in the step of laser patterning.

The solar cell module provided in this manner was installed on a roof and observed from a distance of 20 m. As a result, it was found that satisfactory appearance without glittering was attained.

EXAMPLE 5

A figured glass having the similar shape as that used in Comparative Example 2 was used as the glass substrate, and the solar cell module was fabricated in accordance with the method described with reference to FIG. 12.

First, as shown in FIG. 12, laser irradiation was performed as represented by the arrow A while glass substrate 30 was immersed in water 91 with the light entering surface facing upward. Thereafter, laser irradiation was performed while the glass substrate 30 was immersed in wafer 91 with the light entering surface facing downward. In this manner, laser irradiation was performed both from the side of the light entering surface and the side of the photo semiconductor device forming surface of glass substrate 30. As a result, it was found that satisfactory patterns could be formed no matter from which side laser irradiation was performed, and no problem was experienced in the step of laser patterning.

The solar cell module provided in this manner was installed on a roof and observed from a distance of 20 m. As a result, it was found that satisfactory appearance without glittering was attained.

Industrial Applicability

As described above, according to the present invention, a thin film based solar cell module with antiglare measure can be manufactured by slightly changing the process steps and material, other than the use of a figured glass having prescribed recesses and protrusions formed on the light entering surface in place of the common flat glass which has been used conventionally as the glass substrate.

What is claimed is:
1. A solar cell module, comprising:
    a glass substrate having first and second surfaces, and
    a photo semiconductor element formed on said first surface of said glass substrate; wherein
    said glass substrate is formed of figured glass having recesses and protrusions formed on said second surface through which light enters, to provide antiglaring effect, said second surface having an arithmetic mean roughness Ra within the range of 50 μm to 500 μm and a mean distance Sm between recesses and protrusions within the range of 0.1 mm to 10 mm; and
    said photo semiconductor element is formed by successively stacking a first electrode layer, a photo semiconductor layer, and a second electrode layer, said first electrode layer, said photo semiconductor layer, and said second electrode layer being divided into a plurality of areas.

2. The solar cell module according to claim 1, wherein at least one of said first electrode layer, said photo semiconductor layer, and said second electrode layer is divided into a plurality of areas by a step of laser patterning, and
    an area corresponding to 100 μm to 5000 μm around a portion to be irradiated with laser in a step of laser patterning of said second surface of said glass substrate has an arithmetic mean roughness Ra of at most 500 μm.

3. The solar cell module according to claim 2, wherein an area corresponding to 100 μm to 5000 μm around a portion to be irradiated with laser in said step of laser pattering of said second surface of said glass substrate has an arithmetic mean roughness Ra of at most 100 μm.

4. A method of manufacturing a solar cell module, comprising the steps of:
    successively stacking a first electrode layer, a photo semiconductor layer, and a second electrode layer on a first surface of a glass substrate; and
    dividing said first electrode layer, said photo semiconductor layer, and said second electrode layer into a plurality of areas; wherein
    at least one of said first electrode layer, said photo semiconductor layer, and said second electrode layer is divided into a plurality of areas by a step of laser patterning;
    said glass substrate is formed of a figured glass having recesses and protrusions formed on a second surface through which light enters, to provide antiglaring effect;
    said method further comprising
        before a step of laser patterning, a step of placing a transparent material having index of refraction of 1.3 to 1.7 on at least a portion to be irradiated with laser of said second surface of said glass substrate for smoothing the surface to be irradiated with laser.

5. The method of manufacturing a solar cell module according to claim 4, wherein an index of refraction of said transparent material is 1.45 to 1.55.

6. The method of manufacturing a solar cell module according to claim 4, further comprising the step of removing said transparent material after said step of laser patterning.

7. The method of manufacturing a solar cell module according to claim 6, wherein an index of refraction of said transparent material is 1.45 to 1.55.

* * * * *